United States Patent
Lee et al.

(10) Patent No.: US 9,502,333 B2
(45) Date of Patent: Nov. 22, 2016

(54) SEMICONDUCTOR DEVICE HAVING CONDUCTIVE VIAS

(71) Applicant: Siliconware Precision Industries Co., Ltd., Taichung (TW)

(72) Inventors: Meng-Tsung Lee, Taichung (TW); Yi-Che Lai, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/056,230

(22) Filed: Oct. 17, 2013

(65) Prior Publication Data
US 2014/0252603 A1 Sep. 11, 2014

(30) Foreign Application Priority Data
Mar. 7, 2013 (TW) ............................. 102107996 A

(51) Int. Cl.
*H01L 23/48* (2006.01)
*H01L 23/498* (2006.01)
*H01L 23/00* (2006.01)

(52) U.S. Cl.
CPC ....... *H01L 23/481* (2013.01); *H01L 23/49811* (2013.01); *H01L 24/14* (2013.01); *H01L 2224/13* (2013.01); *H01L 2924/15788* (2013.01)

(58) Field of Classification Search
CPC .............. H01L 2224/023; H01L 2224/0231; H01L 2224/0233; H01L 2224/02335; H01L 2224/0235; H01L 2224/0237; H01L 2224/02372; H01L 2224/05008; H01L 2224/05024; H01L 2224/05548; H01L 23/481; H01L 23/49811; H01L 24/14; H01L 2224/13
See application file for complete search history.

(56) References Cited

U.S. PATENT DOCUMENTS

| | | | |
|---|---|---|---|
| 4,939,568 A * | 7/1990 | Kato | H01L 21/6835 257/686 |
| 2008/0157316 A1* | 7/2008 | Yang | H01L 24/24 257/685 |
| 2009/0072393 A1* | 3/2009 | Bachman | H01L 24/03 257/737 |
| 2009/0127667 A1* | 5/2009 | Iwata | H01L 21/76898 257/621 |
| 2009/0239336 A1* | 9/2009 | Lee et al. | 438/107 |
| 2011/0133333 A1* | 6/2011 | Kwon et al. | 257/737 |
| 2012/0061823 A1* | 3/2012 | Wu et al. | 257/737 |
| 2012/0074579 A1* | 3/2012 | Su et al. | 257/774 |
| 2012/0086131 A1* | 4/2012 | Wang | 257/774 |
| 2012/0126420 A1* | 5/2012 | Chen et al. | 257/774 |
| 2012/0146216 A1* | 6/2012 | Kang et al. | 257/737 |

(Continued)

*Primary Examiner* — Jarrett Stark
*Assistant Examiner* — Bitew Dinke
(74) *Attorney, Agent, or Firm* — Mintz Levin Cohn Ferris Glovsky and Popeo, P.C.; Peter F. Corless; Steven M. Jensen

(57) ABSTRACT

A semiconductor device is provided, including: a substrate having opposing first and second surfaces and a plurality of conductive vias passing through the first and second surfaces; an insulating layer formed on the first surface of the substrate and exposing end portions of the conductive vias therefrom; and a buffer layer formed on the insulating layer at peripheries of the end portions of the conductive vias, thereby increasing product reliability and good yield.

11 Claims, 4 Drawing Sheets

(56) References Cited

U.S. PATENT DOCUMENTS

| | | | |
|---|---|---|---|
| 2012/0175731 A1* | 7/2012 | Chen et al. | 257/531 |
| 2012/0273960 A1* | 11/2012 | Park et al. | 257/774 |
| 2013/0049197 A1* | 2/2013 | Liao | H01L 23/13 257/738 |
| 2013/0134601 A1* | 5/2013 | Cheng et al. | 257/774 |
| 2014/0021617 A1* | 1/2014 | Lu et al. | 257/758 |
| 2014/0065821 A1* | 3/2014 | Kawa et al. | 438/667 |
| 2014/0091455 A1* | 4/2014 | Strothmann et al. | 257/734 |
| 2014/0131858 A1* | 5/2014 | Pan et al. | 257/737 |
| 2014/0175663 A1* | 6/2014 | Chen et al. | 257/774 |
| 2014/0252603 A1* | 9/2014 | Lee | H01L 23/481 257/737 |

\* cited by examiner

SEMICONDUCTOR DEVICE HAVING CONDUCTIVE VIAS

CROSS-REFERENCES TO RELATED APPLICATIONS

This application claims under 35 U.S.C. §119(a) the benefit of Taiwanese Application No. 102107996, filed Mar. 7, 2013, the entire contents of which is incorporated herein by reference.

BACKGROUND OF THE INVENTION

1. Field of the Invention

This invention relates to semiconductor devices, and, more particularly, to a semiconductor device having conductive vias.

2. Description of Related Art

With the constantly progressing of electronic industry, more and more electronic components can be integrated in a semiconductor device, and as a compact trend of electronic products, the volume of a semiconductor device becomes smaller and smaller. A 3D package technique is therefore developed, which configures a plurality of chips in a semiconductor device. In order to achieve the requirement of stacking those chips on each other, a so-called Through Silicon Vias (TSV) technique is developed, which forms a plurality of passing-through hole in a silicon substrate. Therefore, the processing speed of the semiconductor device can be increased, and the power dissipation can be greatly reduced.

FIG. 1 illustrates a schematic sectional view of a semiconductor device 1 according to the prior art. The semiconductor device 1 includes a silicon substrate 10, an insulating layer 12, an Under Bump Metallurgy (UBM) 13, and a plurality of conductive bumps 14. The silicon substrate 10 has a plurality of through silicon vias 11. The insulating layer 12 is formed on the silicon substrate 10 and exposes end portions of the through silicon vias 11. The UBM 13 is formed on the end portions of the through silicon vias 11. The conductive bumps 14 are formed on the UBM 13.

However, the conductive bumps 14 are soldered on the UBM 13 of the silicon substrate 10 via a reflowing method, and the remaining stresses due to the heat will concentrate on the interface between the conductive bumps 14 and the through silicon vias 11 as a stresses concentration 15 in FIG. 1. The stresses concentration may result in a crack after the conductive bumps 14 are subsequently on board, thereby decreasing the reliability of the semiconductor device 1 and the yield of product.

Therefore, how to overcome the mentioned problems of the prior art is substantially an issue desirably to be solved.

SUMMARY OF THE INVENTION

In view of the above-mentioned problems of the prior art, this invention is to provide a semiconductor device, comprising: a substrate having opposing first and second surfaces and a plurality of conductive vias passing through the first and second surfaces; an insulating layer formed on the first surface of the substrate and exposing end portions of the conductive vias therefrom; and a buffer layer formed on the insulating layer at peripheries of the end portions of the conductive vias.

The present invention further provides a semiconductor device, comprising: a substrate having opposing first and second surfaces and a plurality of conductive vias passing through the first and second surfaces; an insulating layer formed on the first surface of the substrate and exposing end portions of the conductive vias therefrom; a redistribution layer formed on the end portions of the conductive vias and the insulating layer; a dielectric layer formed on the insulating layer and the circuit redistribution layer and having a dielectric layer opening exposing a portion of the redistribution layer; and a buffer layer formed on the dielectric layer at a periphery of the dielectric layer opening.

Hence, the semiconductor devices according to the present invention form an insulating layer on the insulating layer on the peripheries of the end portions of the conductive vias or on the dielectric layer on a periphery of the end portion of the dielectric layer opening, such that the stresses due to the heat while reflowing are reduced to improve the reliability of the semiconductor device and the product yield.

BRIEF DESCRIPTION OF DRAWINGS

The present invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "one", "edge", "first" and "second" in this specification are only for the convenience to describe, not for limiting the scope of embodiment in this invention. Those changes or adjustments of relative relationship without substantial change of technical content should also be considered within the category of implementation.

Figure 1:
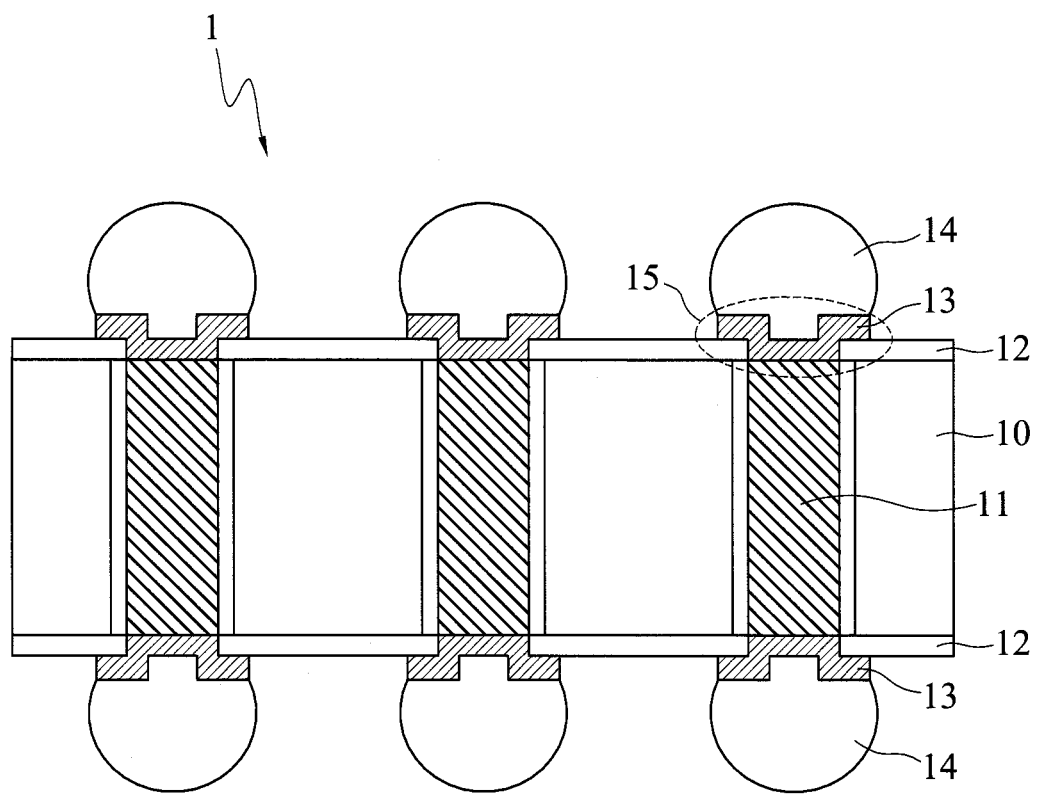
FIG. 1 is a schematic sectional view of a semiconductor device according to the prior art.
Figure 2A:
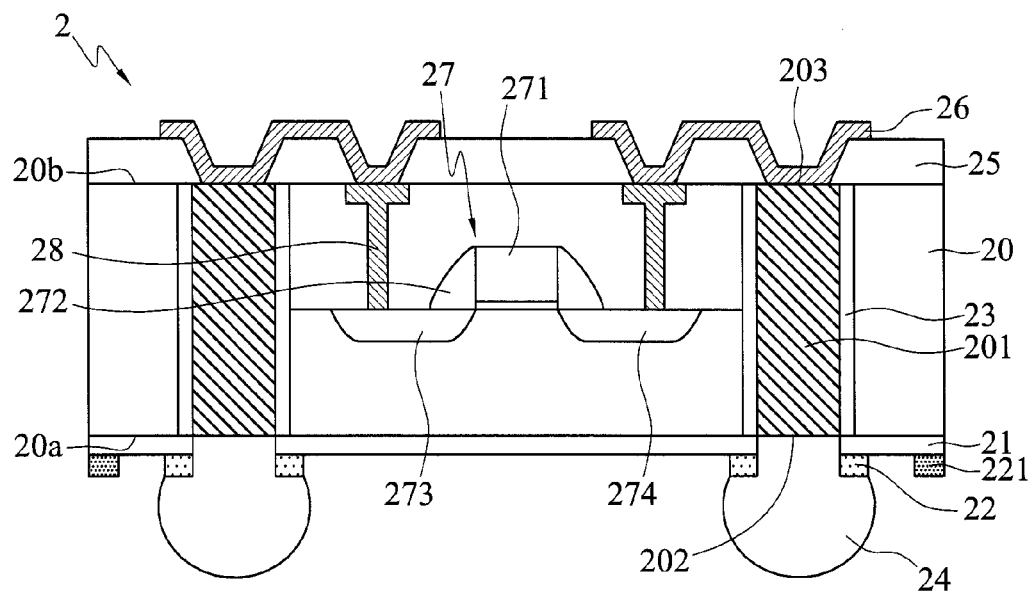
FIG. 2A is a schematic sectional view of a semiconductor device of a first embodiment according to the present invention.

FIG. 2A is a schematic sectional view of a semiconductor device 2 of a first embodiment according to the present invention. The semiconductor device 2 includes a semiconductor substrate 20, a first insulating layer 21, a first buffer layer 22, and a second buffer layer 221.

The semiconductor substrate 20 has a plurality of conductive vias 201, a first surface 20a, and a second surface 20b opposing the first surface 20a. The conductive vias 201 pass through the first surface 20a and the second surface 20b.

The semiconductor substrate 20 may be a silicon substrate, a package substrate, a semiconductor chip, a semiconductor package structure or a Through Silicon Interposer (TSI), and can also be replaced by a glass substrate. The conductive vias 201 may be through silicon vias.

The first insulating layer 21 is formed on the first surface 20a of the semiconductor substrate 20, and exposes first end portions 202 of the conductive vias 201 therefrom.

The first buffer layer 22 is formed on a first insulating layer 21 at peripheries of the first end portions 202 of the conductive vias 201, and the second buffer 221 is formed at a periphery of the first insulating layer 21.

The semiconductor device 2 includes a second insulating layer 23. The second insulating layer 23 is formed between the conductive vias 201 and the semiconductor substrate 20 for electrical insulation, such that a short circuit between the conductive vias 201 and the semiconductor substrate 20 is prevented.

The semiconductor device 2 further comprises a plurality of conductive bumps 24 formed on the first end portions 202 of the conductive vias 201 and the first buffer layer 22.

In another embodiment, an Under Bump Metallurgy (UBM; not illustrated) is formed between the conductive bump 24 and the first end portions 202 of the conductive vias 201. The first buffer layer 22 is formed between the first end portions 202 and the UBM, or is formed between the conductive bump 24 and the UBM, such that the concentrated stresses are released due to the buffer material of the first buffer layer 22.

The semiconductor device 2 comprises a dielectric layer 25 formed on the second surface 20b of the semiconductor substrate 20, and exposes second ends 203 of the conductive vias 201.

The semiconductor device 2 comprises a redistribution layer (RDL) 26 formed on the dielectric layer 25 and electrically connected to the second ends 203 of the conductive vias 201.

The semiconductor device 2 comprises at least one semiconductor element 27 embedded in the semiconductor substrate 20 and having a gate 271, two gate side walls 272, a source region 273, and a drain region 274. The two gate side walls 272 are formed on two sides of the gate 271, respectively. The source region 273 and the drain region 274 are connected to the two gate side walls 272, respectively.

The semiconductor device 2 comprises at least two conductors 28 formed in the semiconductor substrate 20 and electrically connecting the source region 273 and the drain region 274 to the RDL 26 and conductive vias 201.

A method of fabricating the semiconductor device 2 in the first embodiment comprises the following steps of:

providing a substrate 20 having a plurality of conductive vias 201 passing through a first surface 20a and a second surface 20b opposing the first surface 20a of the semiconductor substrate 20;

forming a first insulating layer 21 on the first surface 20a of the semiconductor substrate 20 and exposing the first end portions 202 of the conductive vias 201 therefrom; and forming a first buffer layer 22 on the first insulating layer 21 at peripheries of the first end portions 202 of the conductive vias 201.

Before forming those conductive vias 201, the method further comprises:

forming at least one semiconductor element 27 in the semiconductor substrate 20, wherein the semiconductor element 27 has a gate 271, two gate side walls 272 formed on two sides of the gate 271 respectively, and a source region 273 and a drain region 274 formed on the two gate side walls 272 respectively, wherein the semiconductor element 27 is embedded in the semiconductor substrate 20; and forming at least two conductors 28 in the semiconductor substrate 20 and electrically connecting the source region 273 and the drain region 274.

The method further comprises forming a second insulating layer 23 between the conductive vias 201 and semiconductor substrate 20.

The method further comprises the following steps of:

forming a dielectric layer 25 on the second surface 20b of the semiconductor substrate 20 and exposing the conductive vias 201 and the two conductors 28; and forming an RDL 26 on the dielectric layer 25 and electrically connecting the conductive vias 201 and the two conductors 28.

After forming the first buffer layer 22, the method further comprises forming a plurality of conductive bumps 24 on the first end portions 202 of the conductive vias 201 and the first buffer layer 22.

Figure 2B:
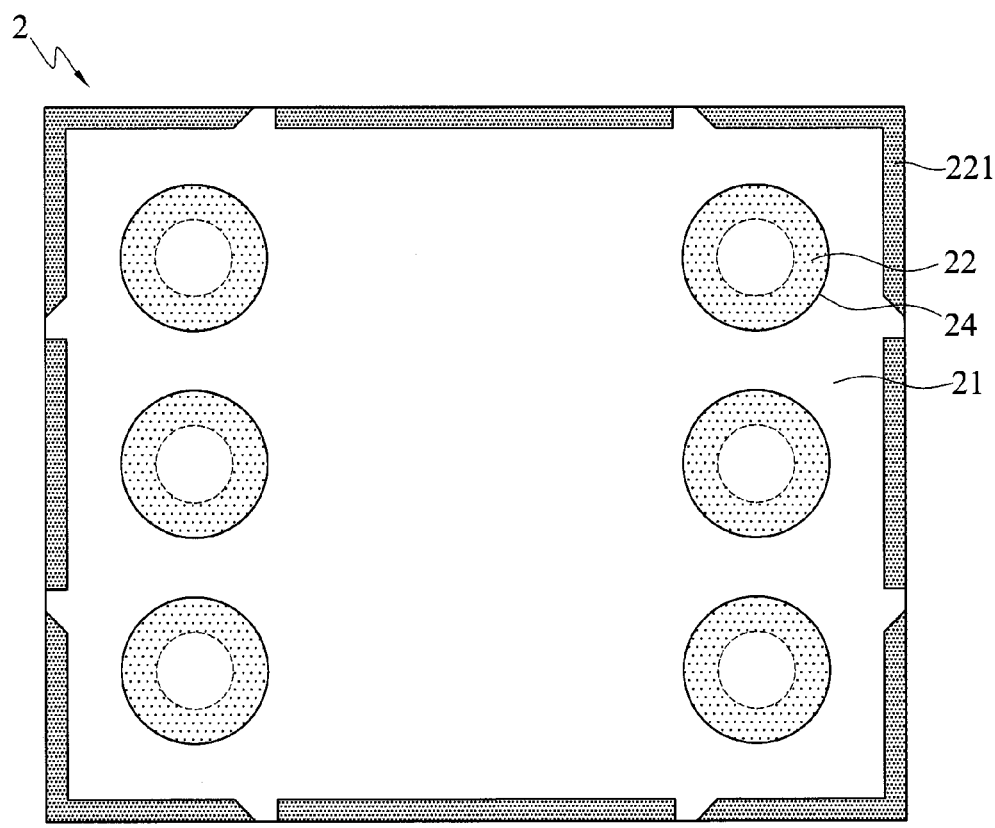
FIG. 2B is a schematic bottom view of a semiconductor device in FIG. 2A according to the present invention.

FIG. 2B is a schematic bottom view of a semiconductor device in FIG. 2A according to the present invention. The first buffer layer 22 is formed on the first insulating layer 21 on the peripheries of the first end portions 202 of the conductive vias 201, and the second buffer layer 221 is formed at the pheriphery of the first insulating layer 21. The first buffer layer 22 is a circular buffer ring, the second buffer layer 221 is a rectangular (or square) buffer ring, and the buffer ring may be a continuous or discontinuous shape.

Figure 3:
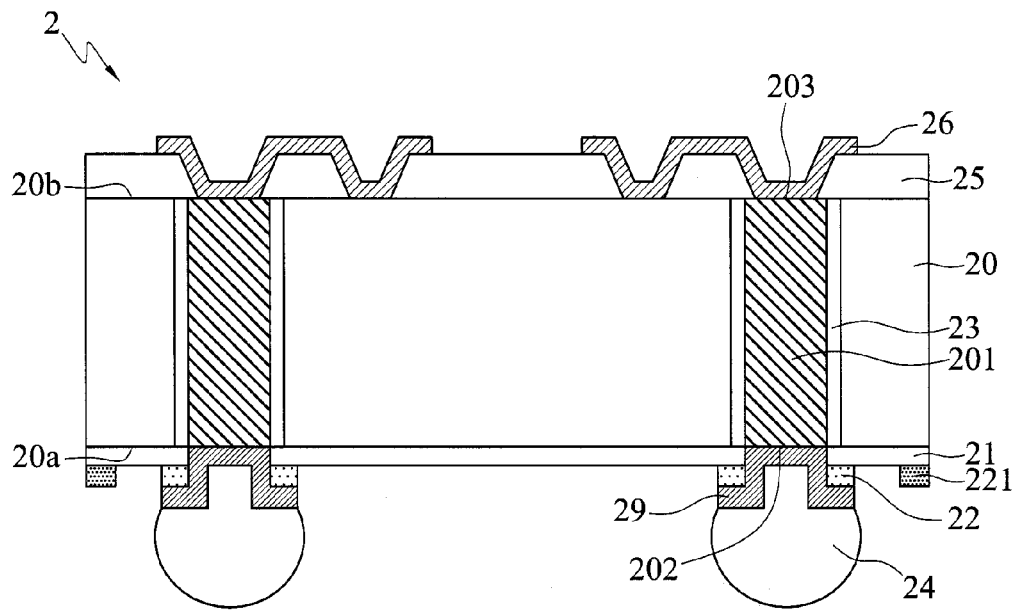
FIG. 3 is a schematic sectional view of a semiconductor device of a second embodiment according to the present invention.

FIG. 3 is a schematic sectional view of a semiconductor device of a second embodiment according to the present invention. The second embodiment is mostly identical with the semiconductor device 2 of the first embodiment in FIG. 2A, and the major difference therebetween is described as follows.

The semiconductor device 2 further comprises an UBM 29 formed on the first end portions 202 of the conductive vias 201 and the first buffer layer 22. The conductive bumps 24 are formed on the UBM 29.

In an embodiment, the semiconductor substrate 20 is a TSI.

In other embodiments, the semiconductor device 2 also has a semiconductor element 27 and two conductors 28 in FIG. 2A.

A method of fabricating a semiconductor device 2 of the second embodiment is mostly identical with above method of fabricating a semiconductor device 2 of the first embodiment in FIG. 2A. The major difference therebetween is described as follows.

After forming a first buffer layer 22, the method further comprises the following steps of:

forming an UBM 29 on the first end portions 202 of the conductive vias 201 and the first buffer layer 22; and forming the conductive bumps 24 on the UBM 29.

The method of fabricating the semiconductor device 2 may further comprise forming a semiconductor element 27 and two conductors 28 of FIG. 2A in the semiconductor substrate 20.

Figure 4:
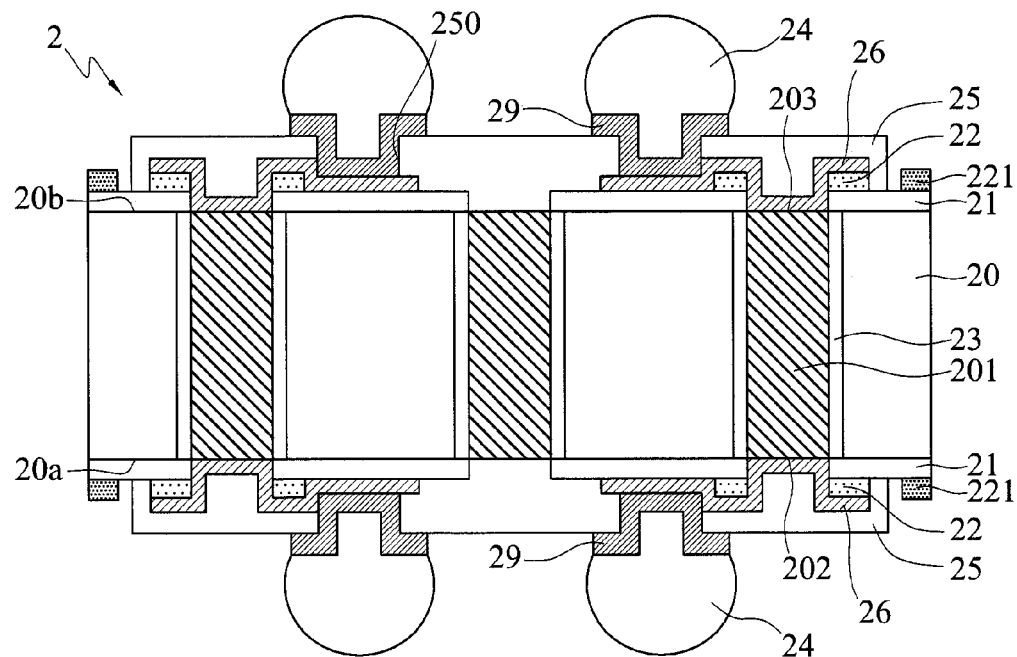
FIG. 4 is a schematic sectional view of a semiconductor device of a third embodiment according to the present invention.

FIG. 4 is a schematic sectional view of a semiconductor device of a third embodiment according to the present invention. The third embodiment is mostly identical with the semiconductor device 2 of the first embodiment in FIG. 2A, and the major difference therebetween is described as follows.

The first insulating layer 21 may also be formed on the second surface 20b of the semiconductor substrate 20, the first buffer layer 22 may also be formed on the peripheries of the second portions 203 of the conductive vias 201, and the second buffer layer 221 may also be formed at the periphery of the first insulating layer 21 of the second end portions 203.

The semiconductor device 2 may comprises a RDL 26 and a dielectric layer 25. The RDL 26 is formed on the first insulating layer 21, the first end portions 202, the second end portions 203 and the first buffer layer 22. The dielectric layer 25 is formed on the first insulating layer 21 and the RDL 26, and has a dielectric layer opening 250 exposing a portion of the RDL 26.

The semiconductor device 2 may comprise an UBM 29 formed on an exposed surface of the RDL 26, and the conductive bumps 24 are formed on the UBM 29.

In addition, the semiconductor device 2 may also has a semiconductor device 27 and two conductors 28 in FIG. 2A.

A method of fabricating a semiconductor device 2 of the third embodiment is mostly identical with above method of fabricating a semiconductor device 2 of the first embodiment in FIG. 2A. The major difference therebetween is described as follows.

The method may further comprise forming the first insulating layer 21 on the second surface 20b of the semiconductor substrate 20.

The method may further comprise the following steps of:

forming the first buffer layer 22 on the first insulating layer 21 on the peripheries of the second end portion 203 of the conductive vias 201; and forming the second buffer layer 221 at the periphery of the first insulating layer 21.

The method may further comprise the following steps:

forming the RDL 26 on the first insulating layer 21, the first end portions 202, the second end portions 203 and the first buffer layer 22;

forming the dielectric layer 25 on the first insulating layer 21 and the RDL 26, wherein the dielectric layer 25 has a dielectric layer opening 250 exposing a portion of the RDL 26;

forming an UBM 29 on the exposed portion of the RDL 26; and forming the conductive bumps 24 on the UBM 29.

The method of fabricating the semiconductor device 2 may further comprise forming a semiconductor element 27 and two conductors 28 of FIG. 2A in the semiconductor substrate 20.

Figure 5:
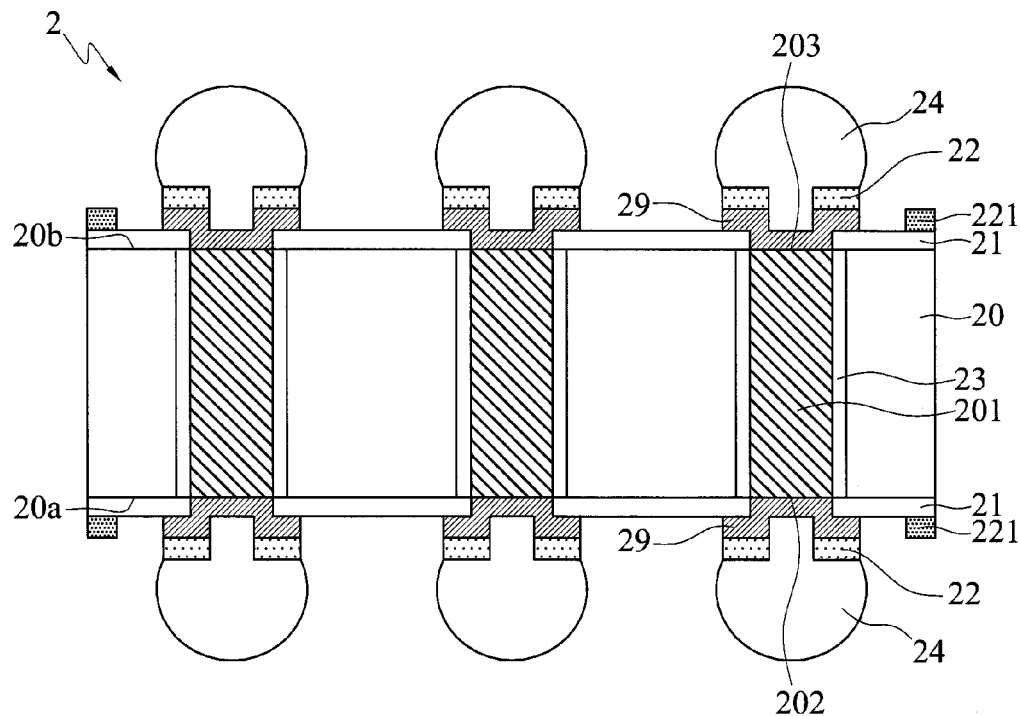
FIG. 5 is a schematic sectional view of a semiconductor device of a fourth embodiment according to the present invention.

FIG. 5 is a schematic sectional view of a semiconductor device of a fourth embodiment according to the present invention. The fourth embodiment is mostly identical with the semiconductor device 2 of the first embodiment in FIG. 2A, and the major difference therebetween is described as follows.

The first insulating layer 21 may also be formed on the second surface 20b of the semiconductor substrate 20, the first buffer layer 22 may also be formed on the first insulating layer on the peripheries of the second portion 203 of those conductive vias 201, and the second buffer layer 221 may also be formed at the periphery of the first insulating layer 21.

The semiconductor device 2 may comprise an UBM 29 formed on the first end portions 202 and second end portions 203 of the conductive vias 201 and formed between the first insulating layer 21 and the first buffer layer 22, and the first buffer layer 22 exposes a portion of the UBM 29. The conductive bumps 24 are formed on the first buffer layer 22 and the exposed portion of the UBM 29.

The semiconductor device 2 may also has a semiconductor device 27 and two conductors 28 in FIG. 2A.

A method of fabricating a semiconductor device 2 of the fourth embodiment is mostly identical with above method of fabricating a semiconductor device 2 of the first embodiment in FIG. 2A. The major difference therebetween is described as follows.

The method may further comprise forming the first insulating layer 21 on the second surface 20b of the semiconductor substrate 20.

The step of forming a first buffer layer 22 on the first insulating layer 21 on the peripheries of the second end portion 203 of the conductive vias 201 may further comprise the following steps of:

forming an UBM 29 on the first end portions 202 and the second end portions 203, and on the first insulating layers 21 at the peripheries of the first end portions 202 and the second end portions 203; and forming the first buffer layer 22 on the UBM 29 and exposing a portion of the UBM 29.

The method may further comprise, after forming the UBM 29 and the first buffer layer 22, forming a plurality of conductive bumps 24 on the first buffer layer 22 and the exposed portion of the UBM 29.

The method of fabricating the semiconductor device 2 may further comprise forming a semiconductor element 27 and two conductors 28 of FIG. 2A in the semiconductor substrate 20.

Figure 6:
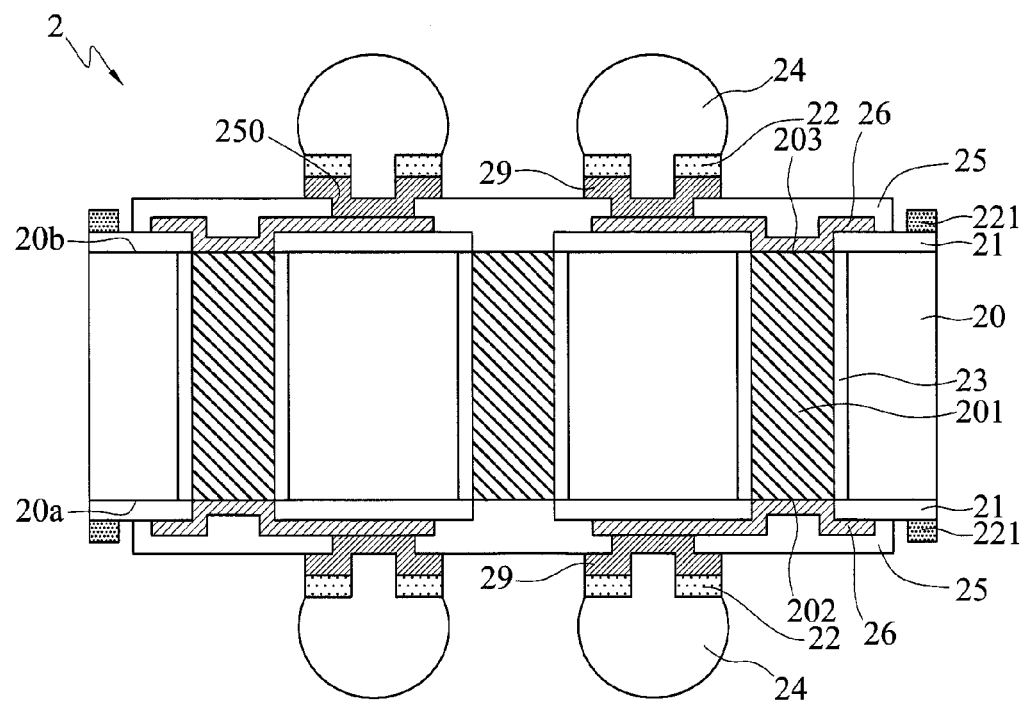
FIG. 6 is a schematic sectional view of a semiconductor device of a fifth embodiment according to the present invention.

FIG. 6 is a schematic sectional view of a semiconductor device of a fifth embodiment according to the present invention. A semiconductor device 2 comprises a semiconductor substrate 20, a first insulating layer 21, an RDL 26, a dielectric layer 25, a first buffer layer 22, and a second buffer layer 221.

The semiconductor substrate 20 has a plurality of conductive vias 201, a first surface 20a and a second surface 20b opposing to the first surface 20a. The conductive vias 201 pass through the first surface 20a and the second surface 20b.

The first insulating layer 21 is formed on the first surface 20a and second surface 20b of the semiconductor substrate 20 and exposes the first end portions 202 and second end portions 203 of the conductive vias 201.

The RDL 26 is formed on the first end portions 202 and second end portions 203 of the conductive vias 201 and the first insulating layer 21.

The dielectric layer 25 is formed on the first insulating layer 21, and the RDL 26 and has a dielectric layer opening 250 exposing a portion of the RDL 26.

The first buffer layer 22 is formed on the dielectric layer 25 at a periphery of the dielectric layer opening 250, and the second buffer layer 221 is formed on the periphery of the first insulating layer 21.

In an embodiment, a semiconductor device 2 may also comprise an UBM 29 formed on the exposed portion of the RDL 26 and between the first buffer layer 22 and the dielectric layer 25. Moreover, the first buffer layer 22 is formed differently on the UBM 29 and exposes a portion of the UBM 29.

The semiconductor device 2 may further comprise a plurality of conductive bumps 24 formed on the first buffer layer 22 and the exposing surface of the UBM 29.

In addition, the semiconductor device 2 may also has a semiconductor element 27 and two conductors 28 of FIG. 2A.

A method of fabricating a semiconductor device 2 of the fifth embodiment comprises the following steps of:

providing a substrate 20 having a plurality of conductive vias 201 pass through a first surface 20a and a second surface 20b opposing to the first surface 20a of the semiconductor substrate 20;

forming a first insulating layer 21 on the first surface 20a and second surface 20b of the semiconductor substrate 20 and exposing the first end portions 202 and second end portions 203 of the conductive vias 201 therefrom;

forming a RDL 26 on the first end portions 202, the second end portions 203 and the first insulating layer 21;

forming a dielectric layer 25 on the first insulating layer 21 and the RDL 26, wherein the dielectric layer 25 has a dielectric layer opening 250 exposing a portion of the RDL 26; and forming a first buffer layer 22 on the dielectric layer 25 at a periphery of the dielectric layer opening 250, or forming a second buffer layer 221 at the periphery of the first insulating layer 21.

The steps of forming the first buffer layer 22 on the dielectric layer 25 may further comprise the following steps:

forming an UBM 29 on the exposed portion of the RDL 26 and on the dielectric layer 25 at the periphery of the dielectric layer opening 250; and forming the first buffer layer 22 on the UBM 29 and exposing a portion of the UBM 29.

The method may further comprise the forming a plurality of conductive bumps 24 on the first buffer layer 22 and the exposed portion of the UBM 29.

From the above, the semiconductor device according to the present invention forms a buffer layer on the first insulating layer on peripheries of the end portions of the conductive vias, the periphery of the first insulating layer, the periphery of the dielectric layer opening or the UBM, then forms the conductive bumps on the buffer layer.

Therefore, when those conductive bumps are soldered on the semiconductor substrate via a reflowing method, the buffer layer greatly reduces the remaining stresses due to the heat, and the present invention approximately reduces 24% of stresses in comparison with the prior art upon the result of an experimental verification. Thus, this invention prevents those conductive bumps from cracking and improves the reliability of the semiconductor device and the product yield.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A semiconductor device, comprising:
a substrate having opposing first and second surfaces and a plurality of conductive vias passing through the first and second surfaces;
an insulating layer formed on the first surface of the substrate and exposing end portions of the conductive vias therefrom;
a first buffer layer formed as a first buffer ring on the insulating layer at peripheries of the end portions of the conductive vias, wherein an inner surface of the insulating layer is aligned with inner surfaces of the conductive vias, and an inner surface of the first buffer layer is aligned with the inner surface of the insulating layer and the inner surfaces of the conductive vias; and
a second buffer layer formed as a second buffer ring at a periphery of the insulating layer in plan view to surround the first buffer layer formed on the insulating layer at the peripheries of the end portions of the conductive vias.

2. The semiconductor device of claim 1, further comprising a plurality of conductive bumps formed on the end portions of the conductive vias and the first buffer layer on the peripheries of the end portions.

3. The semiconductor device of claim 1, further comprising at least one semiconductor element embedded in the substrate and having a gate, two gate side walls formed on two sides of the gate, respectively, and a source region and a drain region connected to the gate side walls, respectively.

4. The semiconductor device of claim 3, further comprising at least two conductors formed in the substrate and electrically connecting the source region and the drain region to the conductive vias.

5. The semiconductor device of claim 1, further comprising an under bump metallurgy formed on the end portions of the conductive vias and the first buffer layer on the peripheries of the end portions.

6. The semiconductor device of claim 5, further comprising a plurality of conductive bumps formed on the under bump metallurgy.

7. The semiconductor device of claim 1, further comprising a redistribution layer formed on the insulating layer, the end portions of the conductive vias, and the first buffer layer on the peripheries of the end portions.

8. The semiconductor device of claim 7, further comprising an under bump metallurgy formed on the redistribution layer.

9. The semiconductor device of claim 8, further comprising a plurality of conductive bumps formed on the under bump metallurgy.

10. The semiconductor device of claim 1, further comprising an under bump metallurgy formed on the end portions of the conductive vias and formed between the insulating layer and the first buffer layer on the peripheries of the end portions, wherein the first buffer layer exposes a portion of the under bump metallurgy.

11. The semiconductor device of claim 10, further comprising a plurality of conductive bumps formed on the first buffer layer and the exposed portion of the under bump metallurgy.

* * * * *